United States Patent
Du

(10) Patent No.: US 8,120,358 B2
(45) Date of Patent: Feb. 21, 2012

(54) MAGNETIC RESONANCE IMAGING WITH HIGH SPATIAL AND TEMPORAL RESOLUTION

(75) Inventor: Jiang Du, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1317 days.

(21) Appl. No.: 11/735,415

(22) Filed: Apr. 13, 2007

(65) Prior Publication Data

US 2007/0255130 A1 Nov. 1, 2007

Related U.S. Application Data

(60) Provisional application No. 60/792,026, filed on Apr. 13, 2006.

(51) Int. Cl.
*G01V 3/00* (2006.01)
(52) U.S. Cl. ........................................... 324/309
(58) Field of Classification Search .......... 324/300–322; 600/410–435
See application file for complete search history.

(56) References Cited

U.S. PATENT DOCUMENTS

| | | | |
|---|---|---|---|
| 4,581,581 A | 4/1986 | Pelc | |
| 4,706,026 A | 11/1987 | Pelc et al. | |
| 4,751,462 A | 6/1988 | Glover et al. | |
| 6,597,937 B2 * | 7/2003 | Liu et al. | 600/420 |
| 6,597,938 B2 * | 7/2003 | Liu | 600/420 |
| 6,983,182 B2 | 1/2006 | Mistretta | |
| 7,358,730 B2 | 4/2008 | Mistretta et al. | |
| 7,408,347 B2 | 8/2008 | Mistretta et al. | |
| 7,545,967 B1 * | 6/2009 | Prince et al. | 382/130 |
| 2003/0013953 A1 | 1/2003 | Mistretta | |
| 2007/0167729 A1 | 7/2007 | Mistretta et al. | |
| 2007/0255128 A1 | 11/2007 | Du et al. | |
| 2007/0255129 A1 | 11/2007 | Du et al. | |
| 2008/0045833 A1 | 2/2008 | Defreitas et al. | |
| 2009/0009167 A1 | 1/2009 | Du | |

OTHER PUBLICATIONS

Patrick et al., "Contrast-Enhanced MRA of the Carotid Bifurcation Using the TRICKS Technique"; Lippincott Williams & Wilkins Inc. Philadelphia, Topics in MRI; 12(3), 175-181.*
Burr, D.B., "Anatomy and physiology of the mineralized tissues: role in the pathogenesis of osteoarthrosis," Osteoarthritis and Cartilage 12: S20-30 (2004).
Bydder, G.M., "New Approaches to Magnetic Resonance Imaging of Intervertebral Discs, Tendons, Ligaments and Menisci," Spine 27(12):1264-1268 (2003).
Donohue, J.M. et al., "The effects of indirect blunt trauma on adult canine articular cartilage," J Bone Joint Surg Am 65-A: 948-957 (1983).
Dreher, W and D. Leibfritz, "A new method for fast proton spectroscopic imaging: spectroscopic Grease," Magn Reson Med 44:668-672 (2000).

(Continued)

*Primary Examiner* — Dixomara Vargas
(74) *Attorney, Agent, or Firm* — Perkins Coie LLP

(57) ABSTRACT

Methods, systems, and apparatus for magnetic resonance imaging (MRI) are described. In one example, the method includes applying a sample-selective magnetic field gradient sequence along a slice direction to partition responses from a sample under magnetic resonance imaging into a plurality of different regions of slices in the k space, applying spiral readout gradients to the sample to obtain echo data from the sample, and applying a Time Resolved Imaging of Contrast Kinetics imaging technique to sample the different regions of slices in the k space.

12 Claims, 11 Drawing Sheets

OTHER PUBLICATIONS

Du, J.et al., "Imaging of the deep radial and calcified layers of the cartilage using ultrashort TE (UTE) sequence at 3T," In: Proceedings of the 15th Annual Meeting of ISMRM (International Society for Magnetic Resonance in Medicine), Berlin, Germany, 2007, p. 3809.
Duyn, J.H. and C.T.W. Moonen, "Fast proton spectroscopic imaging of human brain using multiple spin-echoes," Magn Reson Med 30: 409-414 (1993).
Erickson, S.J. et al., "Effect of tendon orientation on MR imaging signal intensity: a manifestation of the 'Magic Angle' phenomenon," Radiology 181:389-392 (1991).
Erickson, S.J. et al., The 'magic angle' effect: background physics and clinical relevance. Radiology 188:23-25 (1993).
Ferguson, V.L., et al., "Nanomechanical properties and mineral concentration in articular calcified cartilage and subchondral bone," J Anat 203:191-202 (2003).
Fullerton, G.D. et al., "Orientation of tendons in the magnetic field and its effect on T2 relaxation time," Radiology 155:433-435 (1985).
Fullerton, G.D. and A. Rahal, "Collagen structure: the molecular source of the tendon magic angle effect," J Magn Reson Imaging 25:345-361 (2007).
Gatehouse, P.D. et al. "Contrast-enhanced MRI of the menisci of the knee using ultrashort echo time (UTE) pulse sequences: imaging of the red and white zone," The British Journal of Radiology 77:641-647 (2004).
Goodwin, D.W. et al., "Micro-Imaging of Articular Cartilage: T2, Proton Density, and the Magic Angle Effect," Acad Radiology 5:790-798 (1998).
Guilfoyle, D.N. et al., PEEP—A Rapid Chemical Shift Imaging Method. Magn Reson Med 10:282-287 (1989).
Haase, A. and D. Matthaei, "Spectroscopic Flash NMR imaging (Splash imaging)," J Magn Reson 71:550-553 (1987).
Henkelman, R.M. et al., "Anisotropy of NMR properties of Tissues," Magn Reson Med 32:592-601 (1994).
Hiba, B. et al., "Out-and-In Spiral Spectroscopic imaging in Rat Brain at 7 T," Magn Reson Med; 50:1127-1133 (2003).
Li, B. et al., "The electron miscroscope appearance of the subchondral bone plate in the human femoral head in osteoarthritis and osteoporosis," J Anat 195:101-110 (1999).
Martel-Pelletier, J., "Pathophysiology of osteoarthritis," Osteoarthritis Cartilage 12:S31-S33 (2004).
Muir, P et al., "Role of endochondral ossification of articular cartilage and functional adaptation of the subchondral plate in the development of fatigue microcracking of joints," Bone 38:342-349 (2006).
Park, H.W. et al., "Fast gradient-echo chemical-shift imaging," Magn Reson Med 7:340-345 (1988).
Pauly, J. et al., "Slice-Selective Excitation for Very Short $T_2$ Species," Proc. Society of Magnetic Resonance in Medicine, Book of Abstracts, vol. 1, Eight Annual Meeting and Exhibition, Aug. 12-18, 1989, Amsterdam, The Netherlands, 1989, p. 28.
Robson, M.D. et al., "Magnetic resonance imaging of the Achilles tendon using ultrashort TE (UTE) pulse sequences," Clinical Radiology 59: 727-735 (2004).
Rubenstein, J.D., et al., "Effects of collagen orientation on MR imaging characteristics of bovine articular cartilage," Radiology 188:219-226 (1993).
Song, H.K. et al., "Dynamic MRI with projection reconstruction and KWIC processing for simultaneous high spatial and temporal resolution," Magn Reson Med 52:815-824 (2004).
Squires, G.R. et al., "The pathobiology of focal lesion development in aging human articular cartilage and molecular matrix changes characteristic of osteoarthritis," Arthritis Rheum 48(5):1261-1270 (2003).
Xia, Y, et al., "Origin of cartilage laminae in MRI," J Magn Reson Imaging 7:887-894 (1997).
Alley et al., "Gradient characterization using a Fourier-transform technique," Magn. Reson. Med. 39: 581-587 (1998).
Amann, M. et al., "Three-dimensional spiral MR imaging: application to renal multiphase contrast-enhanced angiography," Magn. Reson. Med. 48: 290-296 (2002).

Barger, A.V. et al., "Time-resolved contrast-enhanced imaging with isotropic resolution and broad coverage using an undersampled 3D projection trajectory,". Magn Reson Med. 48:297-305 (2002).
Bergin, C.J. et al., "Lung parenchyma: projection reconstruction MR imaging," Radiology 179:777-781 (1991).
Bothakur, A. et al., "NMR studies of exchangeable hydrogen in bone," In: Proceedings of the $6^{th}$ Annual Meeting of ISMRM, Sydney, Australia, p. 1804 (1998).
Brittain, J.H. et al., "Ultra-Short TE imaging with single-digit (8 microsecond) TE," In: Proceedings of the $12^{th}$ Annual Meeting of ISMRM, Kyoto, Japan, 2004, p. 629.
Brossmann, J et al., "Short echo time projection reconstruction MR imaging of cartilage: comparison with fat-suppressed spoiled Grass and magnetization transfer contrast MR imaging," Radiology 203(2):501-507 (1997).
Brown, T.R. et al., "NMR chemical shift imaging in three dimensions," Proc Natl Acad Sci USA 79:3523-3526 (1982).
Cho, G. "Detection of hydroxyl ions in bone mineral by solid-state NMR spectroscopy," Science 300:1123-1127 (2003).
Conolly, S. et al., "Variable-rate selective excitation," J Magn Reson 78:440-458 (1988).
De Graaf, A.A. et al., "Quality: Quantification Improvement by Converting Lineshapes to the Lorentzian Type," Magn Reson Med 13:343-357 (1990).
Du et al., "Time-resolved Three-dimensional Pulmonary MR Angiography Using a Spiral-Tricks sequence," Proc. Int. Soc. Mag. Reson. Med. 14:3635 (2006).
Du, J. et al., "Contrast Enhanced Peripheral Magnetic Resonance Angiography Using Time-Resolved Vastly Undersampled Isotropic Projection Reconstruction," J. Magnetic Resonance Imaging, 20:894-900 (2004).
Du, J. et al., "Time-resolved, undersampled projection reconstruction imaging for high resolution CE-MRA of the distal runoff vessels," Magn Reson Med 48:516-522 (2002).
Du, J. et al., "Time-resolved undersampled projection reconstruction Magnetic Resonance imaging of the peripheral vessels using multi-echo acquisition," Magn. Reson. Med. 53: 730-734 (2005).
Du , J. et al., "Multi-echo ultrashort TE (UTE) imaging and T2 mapping of knee cartilage," In: Proceedings of the $14^{th}$ Annual Meeting of Int. Soc. Mag. Reson. Med., Seattle, USA, 2006, p. 57.
Du, J. et al., "Ultrashort Echo Time Spectroscopic Imaging (UTESI) of Cortical Bone," Magnetic Resonance in Medicine 58: 1001-1009 (2007).
Du, J. et al., "Ultrashort TE Spectroscopic Imaging (UTESI): Application to the Imaging of Short T2 Relaxation Tissues in the Musculoskeletal System," Journal of Magnetic Resonance Imaging, submitted for publication on Nov. 9, 2007, currently in press, 74 pages.
Du, J. et al., "Ultrashort TE (UTE) Spectroscopic Imaging of Cortical Bone Using a Variable TE Acquisition and Sliding Window Reconstruction," Proc. Intl. Soc. Mag. Reson. Med. 15: 421 (2007), Joint Annual Meeting ISMRM-ESMRMB, May 19-25, 2007, Berlin, Germany.
Du, J. et al., "Spectroscopic Imaging of the Knee Using an Interleaved Ultrashort TE(UTE) Sequence," Proc. Intl. Soc. Mag. Reson. Med. 15: 1240 (2007), Joint Annual Meeting ISMRM-ESMRMB, May 19-25, 2007, Berlin, Germany.
Du, J. et al., "Ultrashort TE Imaging of the Short T2 components in White Matter Using Half Pulse Excitation and Spiral Sampling," Proc. Intl. Soc. Mag. Reson. Med. 14: 334 (2006).
Duyn, J.H. et al., "Simple correction method for k-space trajectory deviations in MRI," J Magn Reson 132:150-153 (1998).
Fantazinni P., R.J.S. Brown RJS, and C. Ganavaglia, "NMR relaxation in trabecular and cortical bone," Abstracts 15th International Bone Densitometry Workshop, Monterey, Jul. 22-26, 2002 in *Calcified Tissue International*, vol. 71, No. 3, Sep. 2002, p. 275.
Gatehouse, P.D. and G.M. Bydder, "Magnetic resonance imaging of short $T_2$ components in tissue,". Clin Radiol 58:1-19 (2003).
Gatehouse, P.D. et al., "Magnetic resonance imaging of the knee with ultrashort TE pulse sequences," Magn Reson Imaging 22:1061-1067 (2004).
Glover, G.H., "Simple analytic spiral k-space algorithm," Magn. Reson. Med. 42: 412-415 (1999).

Gold, G.E. et al., "MR spectroscopic imaging of collagen: tendons and knee menisci," Magn Reson Med 34:647-654 (1995).
Gold, G.E. et al., "MR imaging of articular cartilage of the knee: new methods using ultrashort Tes," AJR 1998; 170:1223-1226 (May 1998).
Gold et al., "Short Echo Time MR Spectroscopic Imaging of the Lung Parenchyma," Journal of Magnetic Resonance Imaging 15: 679-684 (2002).
Gurney, P. et al. "Long-T2 suppressed Ultra Short-TE 3DPR Imaging," Proc. Intl. Soc. Mag. Reson. Med. 13:787 (2005).
Henkelman, R.M. et al., "Magnetization transfer in MRI: a review," NMR in Biomed 14:57-64 (2001).
Herlihy, A.H. et al., "MRI visualization of wood samples with ultrashort TE sequences," Proc. Intl. Soc. Magn. Reson. Med. 13: 2355 (2005).
Jehenson, P. et al., "Analytical method for the compensation of Eddy-current effects induced by pulsed magnetic field gradient in NMR systems,". J Magn Reson 90:264-278 (1990).
Josan, S, et al., "Double Half RF Pulse for Reduced Sensitivity to Linear Eddy Currents in Ultrashort T2 Imaging," Proc. Intl. Soc. Mag. Reson. Med. 14: 3004 (2006).
Joseph, P.M. and J. Whitley, "Experimental simulation evaluation of ECG-gated heart scans with a small number of views," Med Phys 10(4):444-449 (Jul./Aug. 1983).
Kaye, E. et al., "Consistency of Signal Intensity and R2 in Frozen Porcine Kidney and Liver," Proc. Intl. Soc. Mag. Reson. Med. 14: 1423 (2006).
King, K. et al., "Optimized gradient waveforms for spiral scanning," Magn. Reson. Med. 34: 156-160 (1995).
Korosec, F.R. et al., "Time-resolved contract-enhanced 3D MR angiography," Magn. Reson. Med. 36: 345-351 (1996).
Larkman, D.J., "Parallelised sequences," European Society for Magnetic Resonance in Medicine and Biology (ESMRMB Teaching Syllabus 2005) http://www.esmrmb.org/html/img/pool/07_Larkman.pdf.
Larson, P.E. et al., "Using Adiabatic Inversion Pulses to Suppress Long-$T_2$ Species in Ultra-short Echo Time (UTE) Imaging," Proc. Intl. Soc. Mag. Reson. Med. 13: 786 (2005).
Larson, P.E. et al., "Designing long-$T_2$ suppression pulses for ultrashort echo time imaging," Magn Reson Med 56:94-103 (2006).
Lee, J.H. et al., "Fast 3D imaging using variable-density spiral trajectories with applications to limb perfusion," Magn. Reson. Med. 50: 1276-1285 (2003).
Lu, A. et al., "Improved slice excitation for ultra-short TE imaging with B0 and linear eddy current correction," In: Proc. Intl. Soc. Mag. Reson. Med. 14: 2381 (2006).
Lustig, M. et al., "Fast Spiral Fourier Transform for Iterative MR Image Reconstruction," IEEE International Symposium on Biomedical Imaging: Nano to Macro, 2004, pp. 784-787 (Apr. 15-18, 2004).
Maudsley, A.A. et al., "Spatially resolved high resolution spectroscopy by 'four-dimensional' NMR," J Magn Reson 51:147-152 (1983).
Meyer, C.H., "Fast spiral coronary artery imaging," Magn Reson Med 28: 202-213 (1992).
Mierisova, S. and M. Ala-Korpela, "MR spectroscopic quantification: a review of frequency domain methods," NMR in Biomed 14:247-259 (2001).
Mistretta, C.A., "Highly constrained backprojection for time-resolved MRI," Magn Reson Med 55:30-40 (2006).
Mistretta, C.A. et al., "3D Time-Resolved Contrast-Enhanced MR DSA: Advantages and Tradeoffs," Magn. Reson. Med. 40: 571-581 (1998).
Noll, N.C. et al., "Deblurring for non-2D Fourier transform magnetic resonance imaging," Magn Reson Med 25:319-333 (1992).
Panting, J.R. et al., "Abnormal Subendocardial Perfusion in Cardiac Syndrome X Detectedby Cardiovascular Magnetic Resonance Imaging," The New England Journal of Medicine 346: 1948-1953 (2002).

Pauly, J. et al., "Suppression of long T2 components for short T2 imaging," In: Proceedings of the $10^{th}$ annual meeting of SMRI, New York, USA 1992, Abstract No. 330., p. 145.
Peters, D.C. et al., "Undersampled projection reconstruction applied to MR angiography," Magn Reson Med 43:91-101 (2000).
Rahmer, J. et al., "Three-dimensional radial ultrashort echo-time imaging with $T_2$ adapted sampling," Magn Reson Med 55:1075-1082 (2006).
Reichert, I.L.H., "Magnetic resonance imaging of periosteum with Ultrashort TE pulse sequences," J Magn Reson Imaging 19:99-107 (2004).
Reichert, I.L.H., et al., "Magnetic resonance imaging of cortical bone with ultrashort TE pulse sequences," Magn Reson Imag 23: 611-618 (2005).
Robson, M.D. et al., "Magnetic resonance: an introduction to Ultrashort TE (UTE) imaging," J Comput Assist Tomogr 2003;27(6):825-846 (2003).
Robson, M.D. et al., "Ultrashort TE chemical shift imaging (UTE-CSI)," Magn Reson Med 53:267-274 (2005).
Sartoris, D.J., "Quantitative bone mineral analysis," Chaper 18 In: Bone and Joint Imaging, D. Resnick, editor. Philadelphia: WB Saunders; 1996. p. 154-164.
Schroeder, C. et al., "Slice Excitation for Ultrashort TE Imaging," Proc. Intl. Soc. Mag. Reson. Med. 11: 628 (2004).
Schroeder, C. et al., "Scan Time Reduction for Ultrashort TE Imaging at 3T," Proc. Intl. Soc. Mag. Reson. Med. 11: 630 (2004).
Silver, M.S. et al., "Highly selective $\pi/2$ and $\pi$ pulse generation," J Magn Reson 59:347-351 (1984).
Song, H.K. and F.W. Wehrli, Variable TE gradient and spin echo sequences for in vivo MR microscopy of short $T_2$ species. Magn Reson Med 39:251-258 (1998).
Stoyanova, R. et al., "Application of principal-component analysis for NMR spectral quantification," J Magn Reson Series A 115:265-269 (1995).
Sussman, M.S. et al., "Design of practical $T_2$-selective RF excitation (TELEX) pulses," Magn Reson Med 40:890-899 (1998).
Takahashi, A.M., "Ultrashort TE (UTE) imaging at 8 µsec with 3D vastly undersampled isotropic projection reconstruction (VIPR)," Proc. Intl. Soc. Mag. Reson. Med. 13: 2405 (2005).
Techawiboonwong, A. et al., "Quantification of bone-water concentration in a 3T whole-body imager using solid-state imaging," In: Proceedings of the $14^{th}$ Annual Meeting of ISMRM, Seattle, USA, 2006, p. 3620.
Vasnawala et al., "MR imaging of knee cartilage with FEMR," Skeletal Radiol 31: 574-580 (2002).
Vigen, K.K., "Undersampled Projection-Reconstruction Imaging for Time-Resolved Contract-Enhancing Imaging," Magn. Reson. 43: 170-176 (2000).
Waldman et al., "MRI of the brain with ultrashort echo-time pulse sequences," Neuroradiology 45: 887-892 (2003).
Wanspaura, J.P. et al. "Temperature mapping of frozen tissue using Eddy current compensated half excitation RF pulses," Magn Reson Med 46:985-992 (2001).
Wehrli, F.W. and M.A. Fernandez-Seara,"Nuclear magnetic resonance studies of bone water," Annals of Biomed Engineering 33:79-86 (2005).
Wehrli, F.W. Et al., "Quantitative MRI for the assessment of bone structure and function," NMR in Biomed 19:731-764 (2006).
Ying K. et al., "Echo-time reduction for submillimeter resolution imaging with a 3D phase encode time reduced acquisition method," Magn Reson Med 33:82-87 (1995).
Yudilevich, E. and H. Stark, "Spiral sampling: theory and an application to magnetic resonance imaging," Journal of Optical Society of America A 5(4): 542-553 (Apr. 1988).
Zhu, H. et al., "High Temporal and Spatial Resolution 4D MRA Using Spiral Data Sampling and Sliding Window Reconstruction," Magn Reson Med 52: 14-18 (2004).

* cited by examiner

MAGNETIC RESONANCE IMAGING WITH HIGH SPATIAL AND TEMPORAL RESOLUTION

CROSS REFERENCE TO RELATED APPLICATION

This application claims the benefit of the filing date of U.S. Provisional Application Ser. No. 60/792,026, filed on Apr. 13, 2006, and entitled "High Resolution Time-Resolved Contrast-Enhanced Magnetic Resonance Angiography Using Spiral-TRICKS Sequence," the entire disclosure of which is incorporated herein by reference.

TECHNICAL FIELD

This application relates to magnetic resonance imaging (MRI) and magnetic resonance angiography.

BACKGROUND

Imaging through MRI techniques can be applied in imaging applications in medical, biological, and other fields. An MRI technique can produce an image of a selected part of an object under examination by manipulating the magnetic spins in the part and processing measured responses from the magnetic spins. Three-dimensional (3D) contrast-enhanced magnetic resonance angiography (CE-MRA) can be used for the evaluation of vasculature of most organs in humans. Conventional CE-MRA examinations can be performed using a single phase 3D Fourier Transform gradient echo acquisition of 20-30 seconds.

Time Resolved Imaging of Contrast Kinetics (TRICKS) is a 3D imaging technique developed by Frank R. Korosec, et. al at the University of Wisconsin, Madison, and commercialized by General Electric (GE) Healthcare for rapid dynamic imaging. TRICKS can offer increased temporal resolution compared to conventional dynamic sequences. In one implementation, the TRICKS sequence can divide 3D Cartesian k-space into several subvolumes (for example, regions A, B and C) located at increasing distance from the k-space center. The k-space is an extension of the concept of Fourier space. TRICKS can reacquire k-space center (region A) more often than outer sections (regions B and C). One example of a TRICKS acquisition scheme is: ABACABACA.... TRICKS can be combined with other imaging techniques including under-sampled projection reconstruction (PR).

SUMMARY

In one example, implementations of a fast dynamic imaging sequence called Spiral-TRICKS is described. The implementations can employ spiral readout in-plane and Cartesian volume encoding. The combination of spiral trajectory and TRICKS acquisition can provide time-resolved 3D images with high temporal resolution, high spatial resolution and high signal-to-noise ratio (SNR).

In one aspect, a method for magnetic resonance imaging (MRI) includes applying a sample-selective magnetic field gradient sequence along a slice direction to partition responses from a sample under magnetic resonance imaging into a plurality of different regions of slice is in the k space, applying spiral readout gradients to the sample to obtain echo data from the sample, and applying a Time Resolved Imaging of Contrast Kinetics imaging technique to sample the different regions of slices in the k space.

This, and other aspects, can include one or more of the following features. The method can include controlling a delay in a gradient in the MRI to reduce a distortion and anisotropy in the echo data from the sample. The method can include measuring a phase difference in MRI data of the sample with and without readout gradients, mapping each spiral trajectory in the k space using the measured phase difference, and obtaining k space trajectory measurements using 2D off-center excitation to reduce any eddy current effect in the MRI image. The method can further include using field map measurements by two single short spiral acquisitions at two different echo times to reduce and off-resonance effect in the MRI image. The method can further include measuring k-space trajectories for two low-resolution acquisitions, performing image regridding and fast Fourier transform (FFT) on the k space trajectories for two low resolution acquisitions to generate to complex images, respectively, and using a phase difference between the two complex images to provide an off-resonance map for correcting a phase error.

In another aspect a method for magnetic resonance imaging (MRI) of a sample can include obtaining sample information in a spiral readout trajectory in-plane in a k-space from a section of the sample, employing volume encoding along a slice direction in the k-space in the region, wherein the slice direction is orthogonal to the in-plane, partitioning the encoded section into a plurality of regions in the k-space, the plurality of regions including a central region at the k-space center, and acquiring sample information from the plurality of regions, wherein the sample information from the central region is acquired more often than the sample information from regions away from the k-space center.

This, and other aspects, can include one or more of the following features. The method can include partitioning the encoded section into a plurality of regions of the same size in the k-space. The method can further include assigning regions near the k-space center as little frequency regions. The method can further include assigning the regions away from the k-space center as high frequency regions. The method can further include dividing spiral trajectories substantially in the central region into a plurality of subsets of interleaves. The method can further include covering one subset of interleaves wit sample information acquired from the central region. The method can further include acquiring sample information by asymmetric k-space sampling. Acquiring sample information by the asymmetric k-space sampling can include acquiring sample information from all of the central region and portions of non-central regions. Sample information can be acquired using a Time Resolved Imaging of Contrast Kinetics (TRICKS) imaging technique.

In other aspects, computer program products, embodied on a computer readable media, operable to cause a data processing apparatus to perform the methods described above is described.

In other aspects, systems for magnetic resonance imaging (MRI) are described. The systems include a magnetic field source configured to generate a magnetic field, a radio frequency system configured to transmit and receive radio frequency signals, a sample holder configured to receive and hold a sample, and a data processing apparatus configured to perform the methods described above.

The systems and techniques described here can be implemented in ways that achieve one or more of the following advantages in various applications. The described techniques can be used to achieve contrast-enhanced magnetic resonance angiography which exhibits complete contrast dynamics with excellent separation between the arterial and venous vascular systems. The 3D stack of spiral sequence can be used to provide higher efficiency than some other 3D Cartesian sequences or hybrid projection reconstruction sequences. In addition, the spiral trajectory described in this application can be used to allow longer sampling intervals in MRI imaging and offer more efficient sampling of raw data by circular coverage by the trajectory in the k-space. The complete k-space can be covered with fewer excitations without undersampling artifact. Furthermore, spiral trajectories can permit sampling to begin at the k-space center, which can significantly reduce echo time (TE) and provide intrinsic flow compensation. The combination of spiral and TRICKS acquisition can significantly increase the acquisition speed while preserving high spatial resolution and SNR.

These and other implementations are set forth in the accompanying drawings, the description, and the claims. Other features and advantages will be apparent from the description and drawings, and from the claims.

DESCRIPTION OF DRAWINGS

Like reference symbols in the various drawings indicate like elements.

DETAILED DESCRIPTION

Figure 1A:
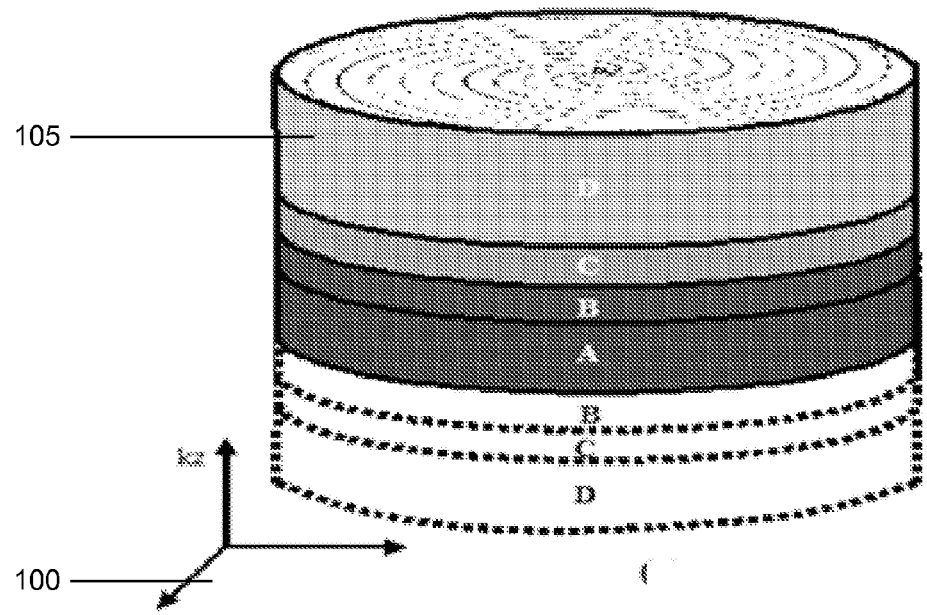
FIG. 1A is a schematic of k-space sampling using a 3D stack of spirals trajectory.

FIG. 1A depicts a k-space 100 sampling using a 3D stack of spirals trajectory with kZ slices 105 partitioned into four regions: A, B, C, and D. In some implementations, a sample-selective magnetic field gradient sequence is applied to a sample along a slice direction to partition responses from the sample under magnetic resonance imaging into a plurality of different regions of slices in the k space. Applying such a magnetic field to sample can enable volume-encoding in MRI measurements. The Spiral-TRICKS sequence can use the spiral readout trajectory in the XY plane, and the Fourier encoding along the slice direction, e.g., the Z direction, in k-space 100. The spiral trajectory can allow for a much longer data acquisition window with an arbitrary imaging field of view (FOV) to achieve a high spatial resolution. The Spiral-TRICKS sequence can combine the high SNR efficient spiral trajectory 110 with high acquisition efficient TRICKS technique for fast dynamic imaging.

In the Spiral-TRICKS sequence, the volume encodings can be partitioned into multiple regions (A, B, C, and D) from the low frequency encoding to high frequency encoding. The partitioned k-space 100 regions can be sampled through TRICKS acquisition order ($A_1B_2A_3 C_4A_5D_6A_7B_8A_9C_{10}A_{11}D_{12}A_{13}B_{14}\ldots$), where the subscript can refer to the acquisition order. Regions A, B, and C can typically be of the same size and can contain the same number of slices. Region D can be the same size of other regions or greater in size than other regions, e.g., three times the size of other regions.

Figure 1B:
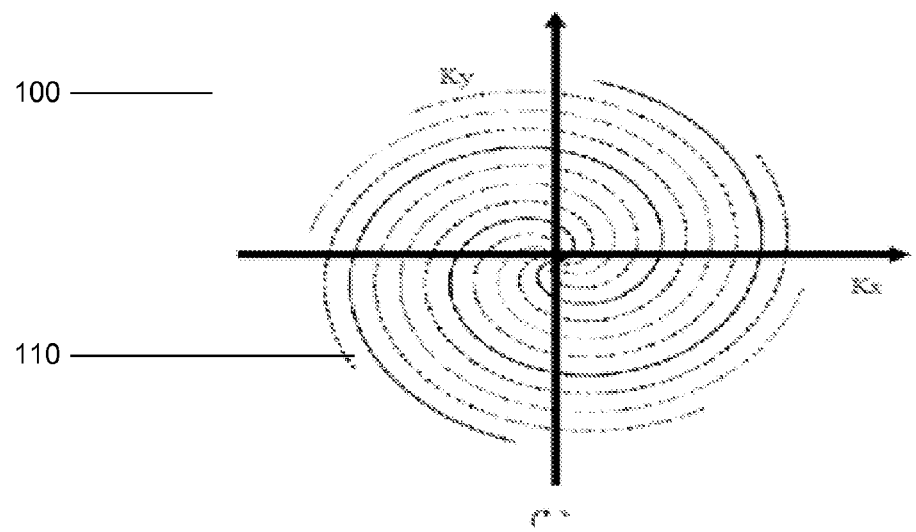
FIG. 1B is a schematic of interleaved spiral trajectory for in-plane sampling.

FIG. 1B depicts interleaved spiral trajectory used for in-plane sampling. The spiral trajectories 110 can be interleaved in k-space 100. To further speed up the acquisition, spiral trajectories 110 from region A can be divided into three subsets of interleaves and each region A acquisition can cover one subset spiral interleaves. In the slice direction, asymmetric k-space sampling, or partial encoding, can be employed to further shorten the total acquisition time. Slices from region A can be fully sampled, while slices from regions B, C, and D can be partially sampled. For example, only one half of regions B, C, and D can be sampled. As a result, only 58% of the slice partitions can be acquired. Homodyne reconstruction along the slice direction can be carried out to recover the slice resolution.

Figure 1C:
FIG. 1C is a schematic of data acquisition.

FIG. 1C depicts the details of one implementation of the Spiral-TRICKS pulse sequence. In some implementations, mask data can be acquired for all regions followed by dynamic data acquisition in the order used in TRICKS. A sliding window reconstruction can be used to generate high spatial resolution time frame images. As depicted in FIG. 1C, the first part of the data acquisition can be for mask. The subsequent dynamic phase acquisition can cover the complete contrast dynamics, including the early arterial phase, peak arterial phase and venous phase. In the reconstruction, k-space subtraction can be performed to suppress background tissue, which is not enhanced upon contrast agent arrival, therefore increasing the image contrast where the blood vessels are enhanced due to the T1 shortening contrast agent. A sliding window reconstruction scheme can be adapted, where the first time frame image can be reconstructed from $A_1B_2A_3C_4A_5D_6$, the second time frame image can be reconstructed from $B_2A_3C_4A_5D_6A_7$, the third time frame image can be reconstructed from $A_3C_4A_5D_6A_7B_8$, etc.

The effects of gradient distortion, eddy current, and off-resonance can be minimized. In some implementations, the gradient distortion and anisotropy can be minimized through gradient delay calibration (a coarse tuning). The gradient delay along each logical gradient can be changed by a predetermined time unit, e.g., 4 μsec, causing the error to be reduced by a corresponding time unit, e.g., 2 μsec. Furthermore, the data acquisition window can be shifted by a time unit, e.g., 1 μsec. Thus, gradient delay errors can be minimized within 1 μsec.

The eddy current effect can be minimized through the k-space trajectory measurement using 2D off-center excitation. Under the 2D off-center excitation, the phase difference with and without readout gradients can be measured to accurately map the true k-space trajectory. Subsequently, the true k-space trajectory can be used to regenerate the grid of raw image data in the k-space. This process of regenerating the grid of raw image data in the k-space is termed regridding. Regridding is a fine tuning process for the k-space distortion. This step can be performed after the gradient delay calibration.

Off-resonance effects are signals that have a frequency different from that expected for a nucleus in an idealized system with perfectly uniform static magnetic field throughout the sample, and perfect linear gradients. The off-resonance effect can be minimized through field map measurements using two single short spiral acquisitions at two different echo times. The k-space trajectories for the two low resolution acquisitions can also be measured, followed by regridding and Fast Fourier Transform (FFT) to generate two complex images. The phase difference between the two low resolution acquisitions can be used to provide an off-resonance map, which can be used to correct the phase error. The k-space trajectory error can be corrected using the measured trajectory.

Figure 2:
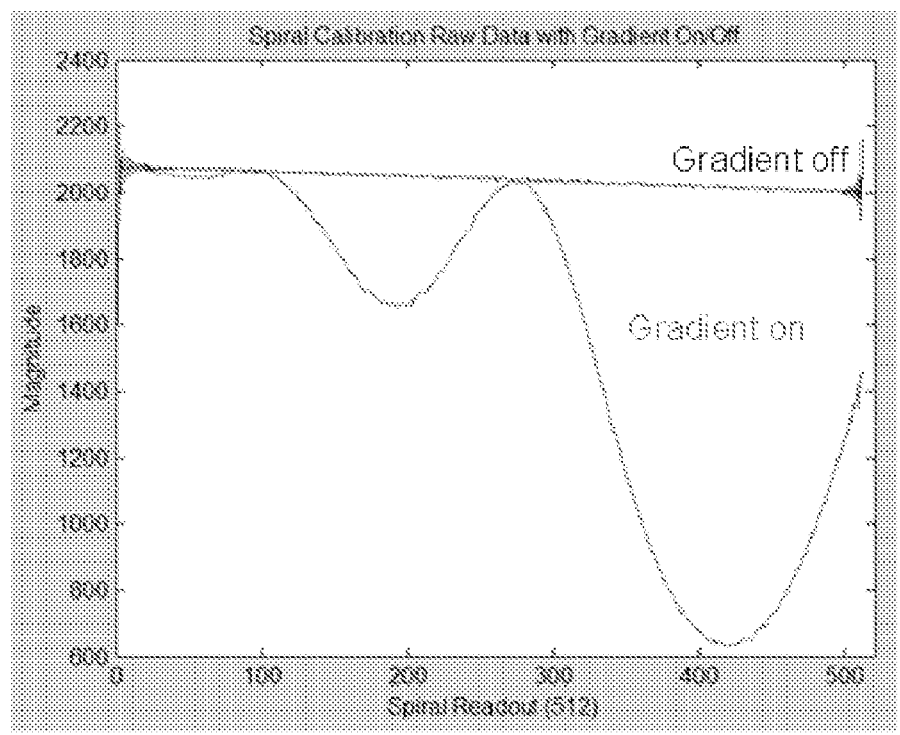
FIG. 2 is a plot of magnitude and phase for trajectory measurements.
Figure 2:
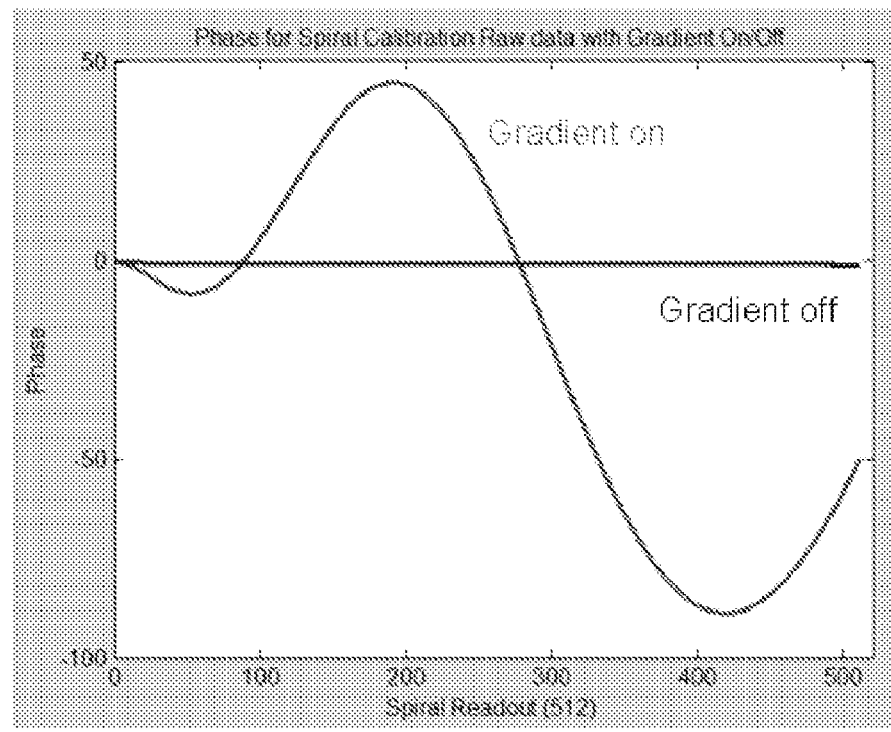

FIG. 2 depicts a first plot of magnitude of spiral calibration raw data with gradient on and gradient off measured across spiral readout and a second plot of phase for spiral calibration raw data with gradient on and gradient off measured across spiral readout. The magnitude and phase for trajectory measurements can be measured using 2D off-center slice excitation with readout gradient on and off. The phase difference between these two acquisition can be used for true trajectory mapping.

Figure 3A:
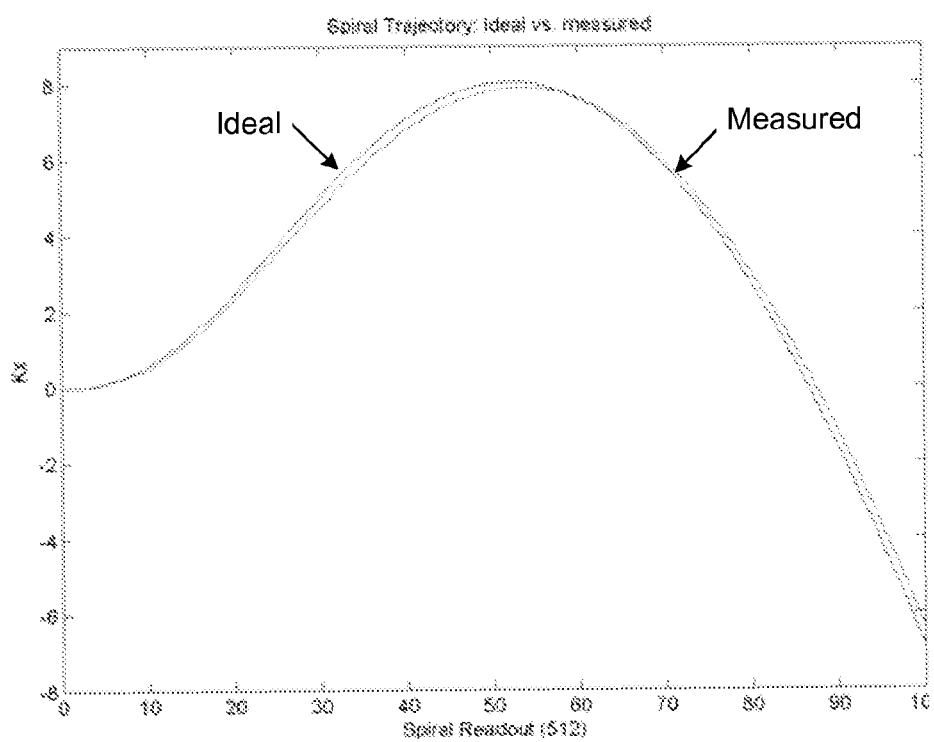
FIG. 3A is a plot of measured and ideal spiral trajectory.
Figure 3B:
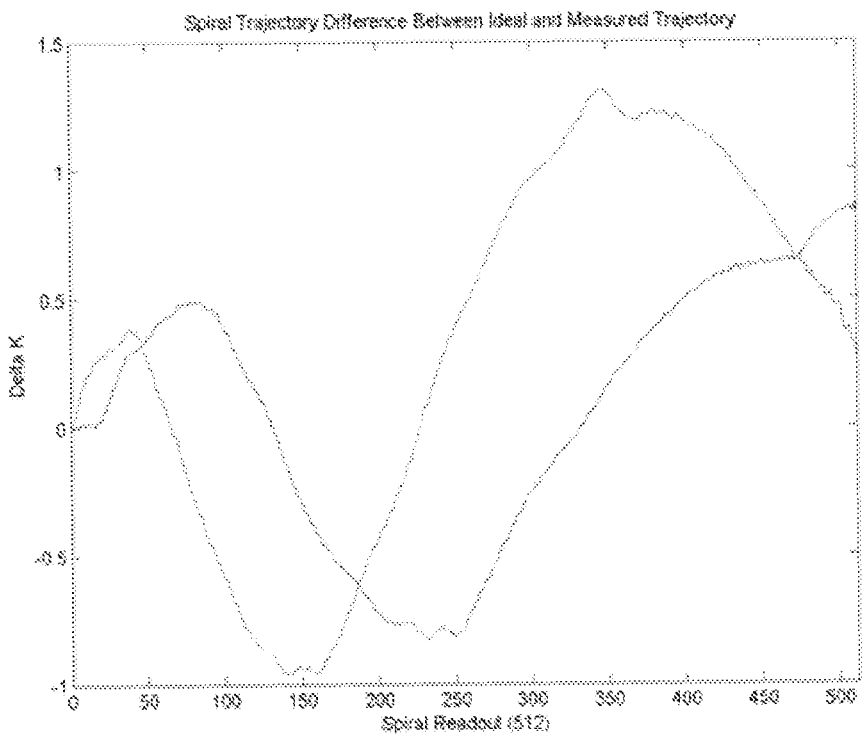
FIG. 3B is a plot of k-space deviation of measured spiral trajectory.

FIG. 3A depicts measured and ideal spiral trajectory for the first 100 out of 512 points. FIG. 3B depicts k-space deviation of measured spiral trajectory for Gx gradient and Gy gradient. FIGS. 2-4 show more information regarding to spiral trajectory measurement and phantom images with and without the above three-step correction algorithm.

Figure 4A:
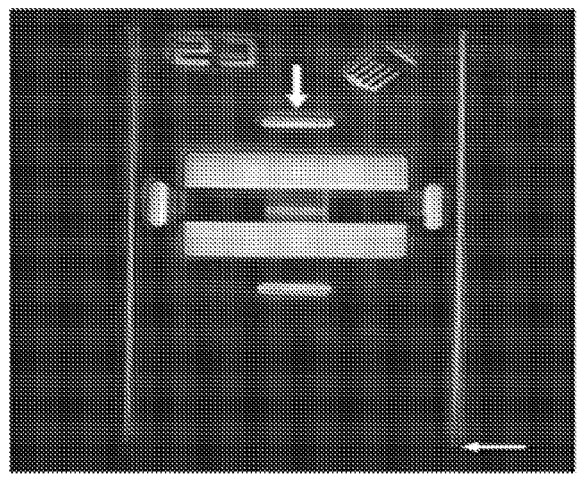
FIGS. 4A, 4B, and 4C are phantom images with and without minimization of distortions.
Figure 4B:
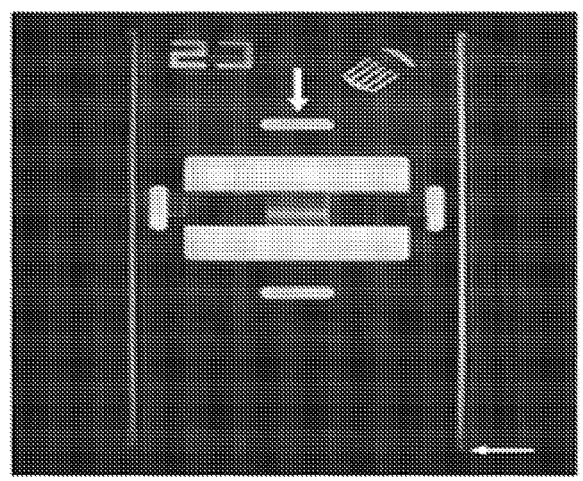
Figure 4C:
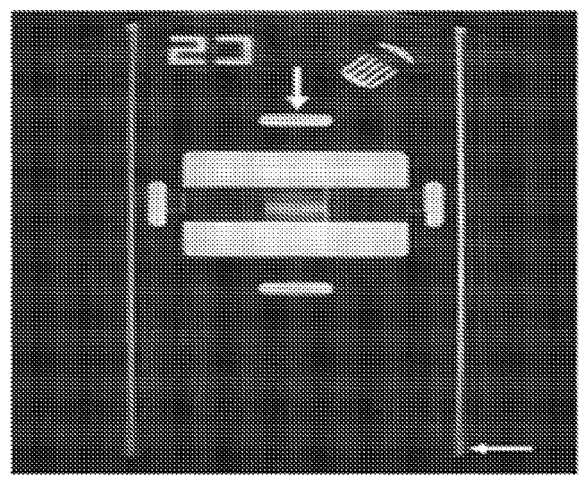

FIGS. 4A, 4B, and 4C depict phantom images with and without corrections by minimization of the gradient distortion, eddy current, and off-resonance. FIG. 4A depicts phantom images without any correction. The correction can be the minimizations of gradient distortion, eddy current, and off-resonance. FIG. 4B depicts phantom images with k-space trajectory measurement. FIG. 4C depicts k-space trajectory measurements plus B0 field map correction. B0 field map can correct the phase errors. The k-space distortion can be corrected using spiral trajectory measurement. Eddy current and gradient distortion can be reduced after trajectory measurement. B0 field map correction can help for signal recovery at the periphery of the imaging FOV, where B0 non-homogeneity can be significant.

The first spiral-TRICKS volunteer scan was performed for pulmonary MRA using an eight element cardiac phased array coil offered by GE Medical Systems (Milwaukee, Wis.). The acquisition parameters for pulmonary imaging are: FOV=30×30 cm, TR/TE=5.1/0.67 ms, flip angle=30°, BW=125 kHz, 512 points per interleaf, 72 spiral interleaves, 36 kz volume encodings in the anterior/posterior direction, slice thickness=3 mm, recon matrix=512×512. A contrast agent (Gd-BOPTA) of about 30 ml was injected intravenously, with an injection rate of 3.0 ml/sec followed by 20 ml flush at the same injection rate. The total scan time was 30 seconds, including mask. The first 7.5 seconds were for mask, and the remainder for the dynamic imaging.

Figure 5:
FIG. 5 is the complete contrast dynamics of the pulmonary vasculature.

FIG. 5 shows the coronal maximum intensity projection (MIP) time frames. Complete contrast dynamics of the pulmonary vasculature was depicted through 15 consecutive time frame images with a temporal resolution of about 1.0 second-per-frame. The acquisition FOV of 300×300×108 mm$^3$, spiral readout of 512, and 72 spiral interleaves result in an acquired voxel size of 1.56×1.56×3.0 mm$^3$, which was zero-padded to 0.63×0.63×0.63 mm$^3$ in the reconstruction. Fifteen time frames were displayed with a high temporal resolution of 1.0 seconds-per-frame which captured the complete contrast dynamics in the lung, including arterial phases, arterial venous transition phases, and venous phases. The high in-plane spatial resolution of 1.56 mm, which was zero-padded to 0.63 mm, provided an excellent depiction of the pulmonary vessels. No significant image blurring was observed because of the three-step corrections.

Figure 6:
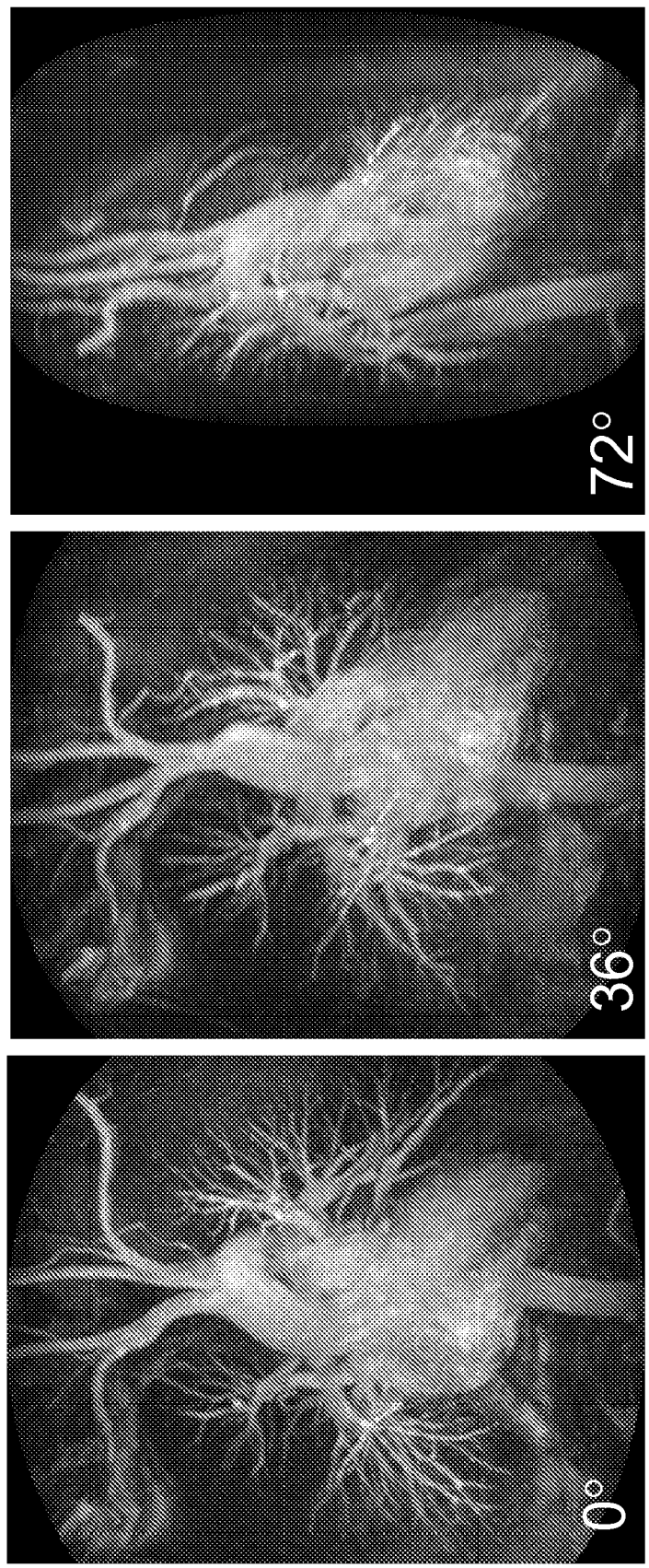
FIG. 6 are 3D pulmonary images shown from different angles.

FIG. 6 depicts the 3D pulmonary images shown from three different angles. The blurring along the slice resolution can be seen because the slice thickness is 3 mm, while the in-plane resolution is 1.56 mm. Both coronal and rotated images were shown in FIG. 6, which demonstrated high in-plane spatial resolution and moderate slice resolution, which was 3 mm thick and zero-padded to 0.63.

A renal study was also performed using Spiral-TRICKS sequence. The acquisition parameters for renal imaging are: FOV=30×30 cm, TR/TE=7.4/0.8 ms, flip angle=30°, BW=125 kHz, 1024 points per interleaf, 48 spiral interleaves, 36 kz volume encodings in the anterior/posterior direction, slice thickness=2.0 mm, reconstruction matrix size=512×512. The complete contrast dynamics were well depicted through 15 consecutive time frames with high in-plane spatial resolution of 1.28 mm (zero-padded to 0.63 mm) and through-plane resolution of 2.0 mm (zero-padded to 0.63 mm). The arterial phase and portal venous phase were well separated despite the fast transition.

Figure 7:
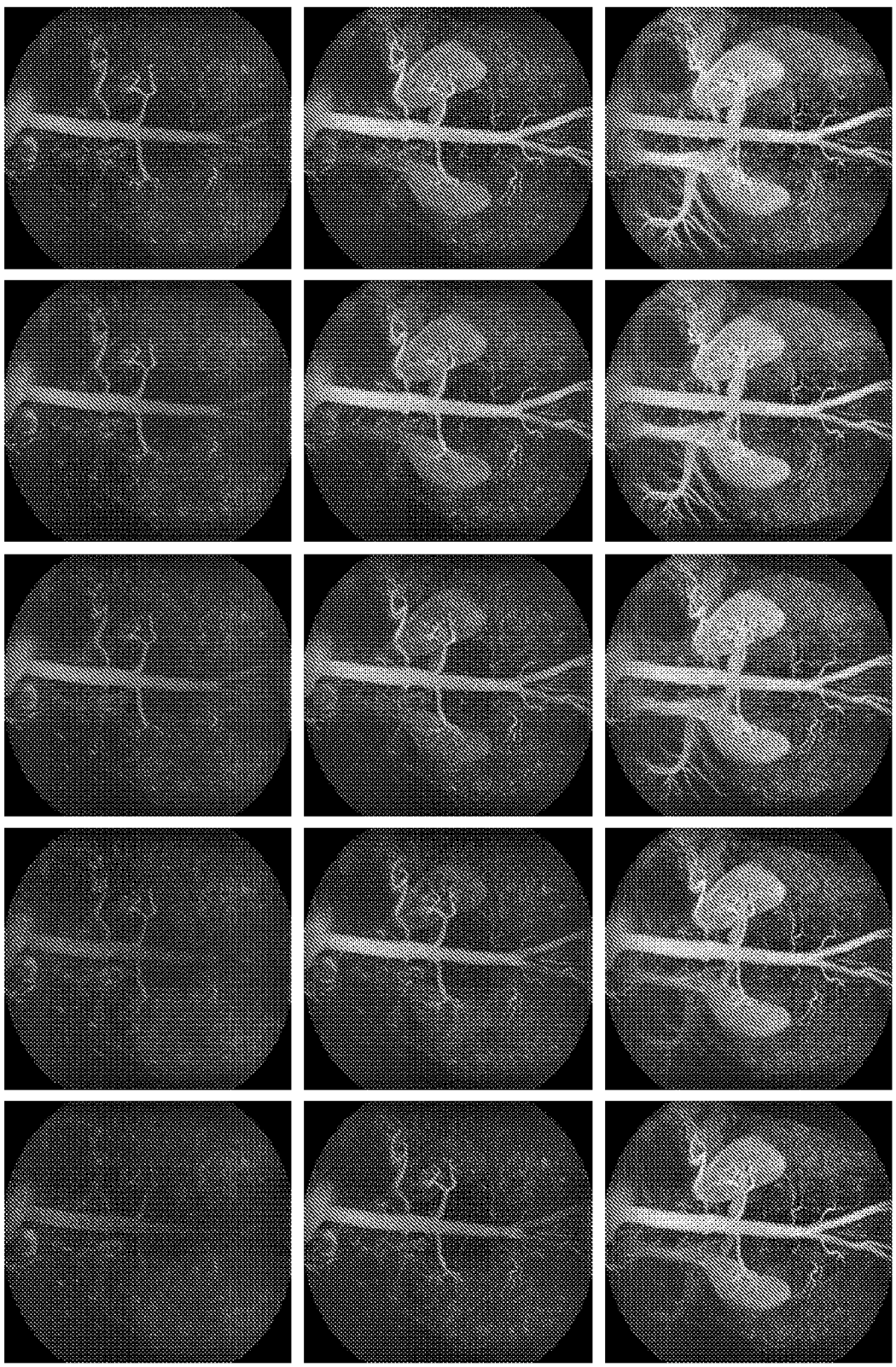
FIG. 7 are series of images depicting the complete contrast dynamics in the renal arteries.

FIG. 7 depicts fifteen time series of images of the complete contrast dynamics in the renal arteries. The depiction of the arterial phase, arterial-venous transition phase and portal venous phase can be seen. The acquisition of FOV of 300× 300×72 mm$^3$, spiral readout of 1024, and 48 spiral interleaves result in an acquired voxel size of 1.28×1.28×2.0 mm$^3$ in the reconstruction. Other imaging parameters include TR/TE=7.4/0.8 ms, flip angle=30°, bandwidth=125 kHz.

Figure 8:
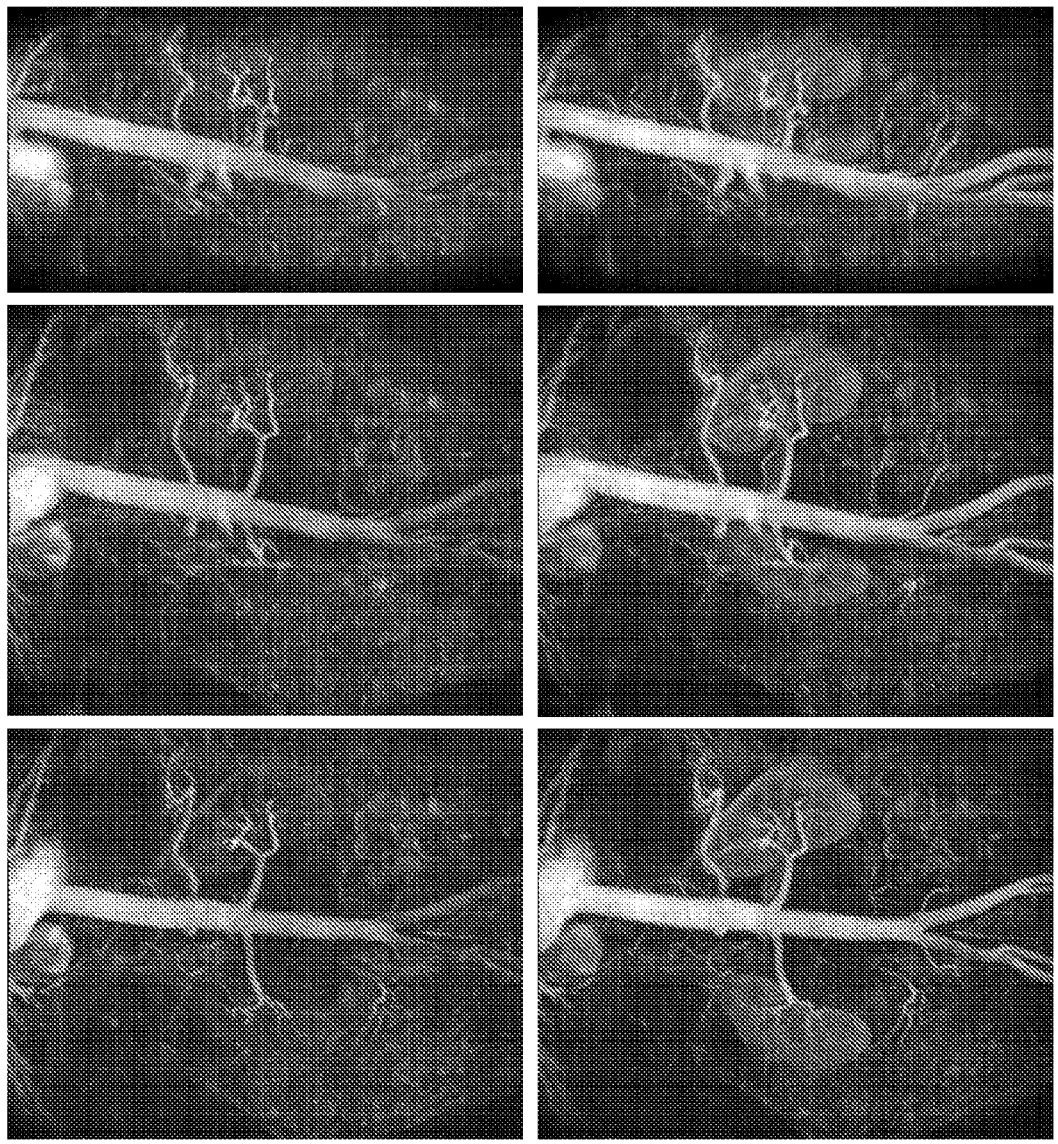
FIG. 8 are rotation of two consecutive time frames to display spatial resolution and fast enhancement.

FIG. 8 shows the rotation of two consecutive arterial phases, which demonstrated the high spatial resolution and quick renal parenchymal enhancement. A high temporal resolution is required to capture the details of the contrast enhancement.

Figure 9:
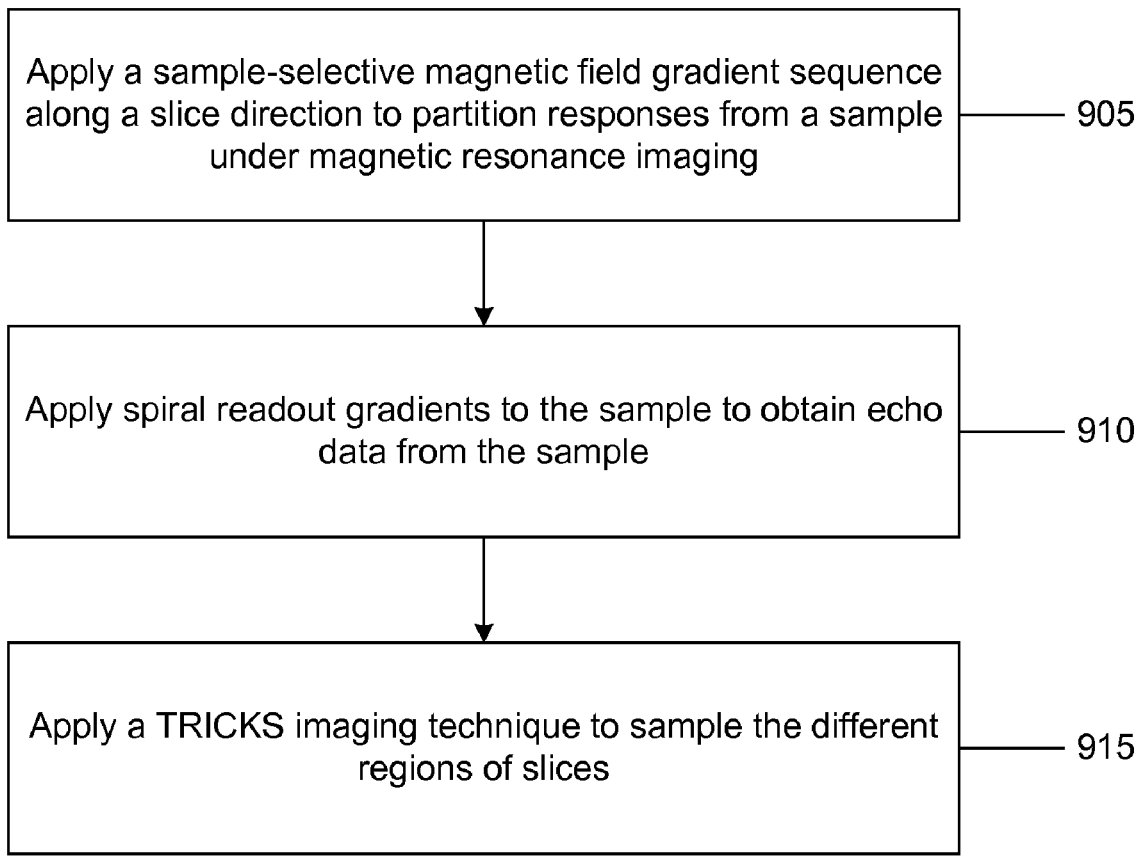
FIG. 9 is a flow chart of an example of a process of magnetic resonance imaging.

FIG. 9 is a flow chart of an example of a process for magnetic resonance imaging of a sample. In some implementations, a slice-selective magnetic field gradient sequence can be applied along a slice direction to partition responses from a sample under magnetic resonance imaging. In addition, spiral readout gradients can be applied to the sample to obtain echo data from the sample. Further, a TRICKS imaging technique can be applied to sample the different regions of slices. In some implementations, a delay in a gradient in the MRI can be controlled to reduce a distortion and anisotropy in the echo data from the sample. In some implementations, a phase difference in MRI data of the sample can be measured with and without readout gradients. In addition, each spiral trajectory in the k-space can be mapped using the measured phase difference, and the k-space trajectory measurements can be obtained using 2D off-center excitation to reduce an eddy current effect in the MRI image.

In some implementations, field map measurements can be used by two single short spiral acquisitions at two different echo times to reduce an off-resonance effect in the MRI image. In addition, the k-space trajectories for two low resolution acquisitions can be measured. Image regridding and fast Fourier transform (FFT) can be performed on the k-space trajectories for two low resolution acquisitions to generate two complex images, respectively. A phase difference between the two complex images can be used to provide an off-resonance map for correcting a phase error.

Figure 10:
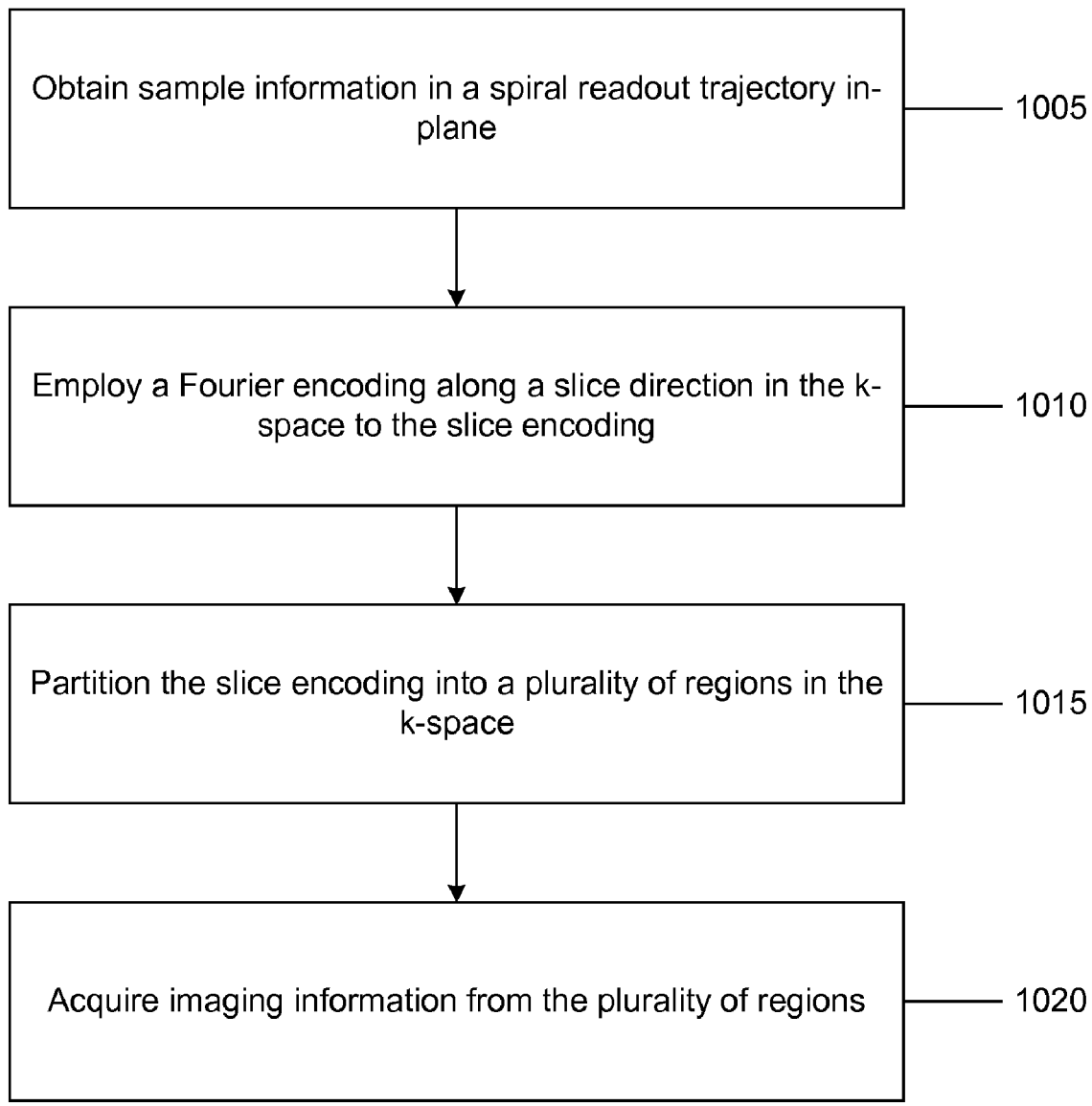
FIG. 10 is a flow chart of an example of a process of magnetic resonance imaging.

FIG. 10 is a flow chart of an example of a process for magnetic resonance imaging (MRI) of a sample. In some implementations, sample information can be obtained in a spiral readout trajectory in-plane in a k-space from a section of the sample at 1005. A spiral readout trajectory in-plane can be employed in a k-space to a volume encoding of the sample. A Fourier encoding can be employed along a slice direction to the encoding in the k-space at 1010. The slice direction can be orthogonal to the in-plane. The sample encoding can be partitioned into a plurality of regions in the k-space at 1015. The plurality of regions can include a central region at the k-space center. Sample information can be acquired from the plurality of regions at 1020. The sample information from the central region can be acquired more often than the sample information from regions away from the k-space center.

Each region of the plurality of regions can be of the same size. The regions near the k-space center can correspond to low frequency encoding. Regions away from the k-space center can correspond to high frequency encoding. The spiral trajectories substantially in the central region can be divided into a plurality of subsets of interleaves. The spiral trajectories can be located either at the center of the k-space or near the center of the k-space within the central region. The information acquired from the central region can cover one subset of interleaves. Sample information can be acquired by asymmetric k-space sampling. In asymmetric k-space sampling, sample information can be obtained from all of the central region and portions of the non-central regions. In other implementations, the sample information can be acquired by a TRICKS imaging technique.

An MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins. The above spiral-TRICKS sequence may be applied in various imaging applications, including but not limited to, (1) contrast-enhanced MRA of pulmonary, renal, carotid and peripheral vasculature, (2) brain arterial venous malformation (AVM), (3) perfusion imaging based on dynamic contrast enhancement information, and (4) tumor and lesion characterization, including breast tumor, liver lesion, prostate tumor, etc, where the contrast enhancement pattern is an indication of benignity or malignity of the tumor.

Figure 11:
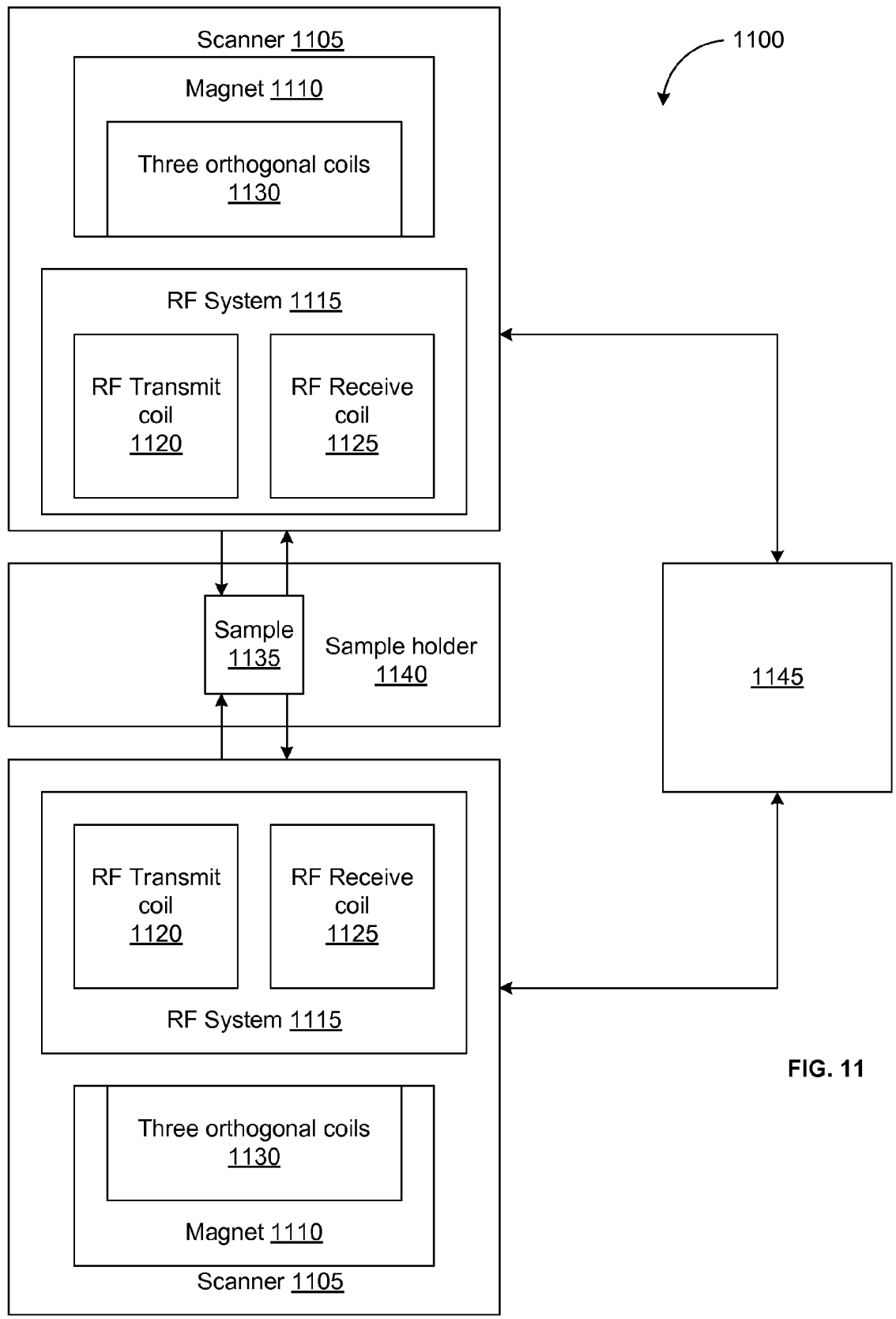
FIG. 11 is an example of an MRI system.

FIG. 11 is an example of an MRI system 1100. The MRI system 1100 can be implemented using any one of various MRI scanners such as a 1.5 T Sigma TwinSpeed scanner (available from GE Healthcare Technologies, Milwaukee, Wis.). The MRI system 1100 can include a scanner 1105, a data processing apparatus 1145, and a sample holder or table 1140 for holding a sample 1135. The scanner can include a main magnet 1110, three orthogonal gradient coils 1130 and an RF system 1115. The main magnet 1110 can be designed to provide a constant, homogeneous magnetic field. The three orthogonal gradient coils 1130 can be designed to provide three orthogonal, controller magnetic gradients used to acquire image data of a desired slice by generating an encoded and slice-selective magnetic field. The RF system 1115 can include an RF transmit coil 1120 and an RF receive 1125 designed to transmit and receive RF pulses. The RF system 1115 can further include an RF synthesizer (not shown) and a power amplifier (not shown). In some implementations, an integrated transceiver coil (not shown) can be implemented instead of the separate transmit coil 1120 and receive coil 1125 for transmitting and receiving RF signals. For example, a close-fitting smaller coil can improve image quality when a small region is being imaged. Further, various types of coils that are placed around specific parts of a body (e.g., the head, knee, wrist, and the like) or even internally can be implemented depending on the sample and imaging applications. The MRI system 1100 can generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins. The data processing apparatus (e.g., a computer 1145 can be designed to receive and process the data obtained from the sample. In addition, the data processing apparatus 1145 can include instructions to instruct the MRI system 1100 to apply the RF signals that generate a slice-selective magnetic field gradient sequence along a slice direction to the sample 1135. Further, the data processing apparatus 1145 can include instructions to apply spiral readout gradients to the sample to obtain echo data. Furthermore, the data processing apparatus 1145 can apply TRICKS imaging technique to the sample, and any other image processing technique to the sample.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few examples are described. Other implementations, variations and enhancements may be made based on what is disclosed in this application.

What is claimed is:

1. A method for magnetic resonance imaging (MRI), comprising:
    applying a magnetic field gradient sequence along a slice direction to partition responses from a sample under magnetic resonance imaging into a plurality of different regions of slices in k-space;
    applying spiral readout gradients to the sample to obtain echo data from the sample;
    applying a Time Resolved Imaging of Contrast Kinetics imaging technique to sample the different regions of slices in the k-space; and
    controlling a delay in a gradient in the MRI to reduce a distortion and anisotropy in the echo data from the sample.

2. The method of claim 1, further comprising:
    measuring a phase difference in MRI data of the sample with and without readout gradients;
    mapping each spiral trajectory in the k-space using the measured phase difference; and
    obtaining k-space trajectory measurements using 2D off-center excitation to reduce an eddy current effect in the MRI image.

3. A computer program product, embodied on a non-transitory computer readable medium, operable to cause a data processing apparatus to perform the method of claim 1.

4. The computer program product of claim 3, the operations further comprising:
    measuring a phase difference in MRI data of the sample with and without readout gradients;
    mapping each spiral trajectory in the k-space using the measured phase difference; and
    obtaining k-space trajectory measurements using a 2D off-center excitation to reduce an Eddy current effect in the MRI image.

5. A method for magnetic resonance imaging (MRI), comprising:
    applying a magnetic field gradient sequence along a slice direction to partition responses from a sample under magnetic resonance imaging into a plurality of different regions of slices in k-space;
    applying spiral readout gradients to the sample to obtain echo data from the sample;

applying a Time Resolved Imaging of Contrast Kinetics imaging technique to sample the different regions of slices in the k-space; and using field map measurements by two single short spiral acquisitions at two different echo times to reduce an off-resonance effect in the MRI image.

6. The method of claim 5, further comprising:

measuring k-space trajectories for two low resolution acquisitions;

performing image regridding and fast Fourier transform (FFT) on the k-space trajectories for two low resolution acquisitions to generate two complex images, respectively; and using a phase difference between the two complex images to provide an off-resonance map for correcting a phase error.

7. A computer program product, embodied on a non-transitory computer readable medium, operable to cause a data processing apparatus to perform the method of claim 5.

8. The computer program product of claim 7, the operations further comprising:

measuring k-space trajectories for two low resolution acquisitions;

performing image regridding and fast Fourier transform (FFT) on the k-space trajectories for two low resolution acquisitions to generate two complex images, respectively; and using a phase difference between the two complex images to provide an off-resonance map for correcting a phase error.

9. A system for magnetic resonance imaging (MRI), comprising:

a magnetic field source configured to generate a magnetic field;

a radio frequency system configured to transmit and receive radio frequency signals;

a sample holder configured to receive and hold a sample; and a data processing apparatus configured to:

apply a magnetic field gradient sequence along a slice direction to partition responses from a sample under magnetic resonance imaging into a plurality of different regions of slices in k-space;

apply spiral readout gradients to the sample to obtain echo data from the sample;

apply a Time Resolved Imaging of Contrast Kinetics imaging technique to sample the different regions of slices in the k-space; and control a delay in a gradient in the MRI to reduce a distortion and anisotropy in the echo data from the sample.

10. The system of claim 9, wherein the data processing apparatus is further configured to:

measure a phase difference in MRI data of the sample with and without readout gradients;

map each spiral trajectory in the k-space using the measured phase difference; and obtain k-space trajectory measurements using 2D off-center excitation to reduce an eddy current effect in the MRI image.

11. A system for magnetic resonance imaging (MRI), comprising:

a magnetic field source configured to generate a magnetic field;

a radio frequency system configured to transmit and receive radio frequency signals;

a sample holder configured to receive and hold a sample; and a data processing apparatus configured to:

apply a magnetic field gradient sequence along a slice direction to partition responses from a sample under magnetic resonance imaging into a plurality of different regions of slices in k-space;

apply spiral readout gradients to the sample to obtain echo data from the sample;

apply a Time Resolved Imaging of Contrast Kinetics imaging technique to sample the different regions of slices in the k-space; and use field map measurements by two single short spiral acquisitions at two different echo times to reduce an off-resonance effect in the MRI image.

12. The system of claim 11, wherein the data processing apparatus is further configured to:

measure k-space trajectories for two low resolution acquisitions;

perform image regridding and fast Fourier transform (FFT) on the k-space trajectories for two low resolution acquisitions to generate two complex images, respectively; and use a phase difference between the two complex images to provide an off-resonance map for correcting a phase error.

* * * * *

UNITED STATES PATENT AND TRADEMARK OFFICE
CERTIFICATE OF CORRECTION

PATENT NO. : 8,120,358 B2  Page 1 of 1
APPLICATION NO. : 11/735415
DATED : February 21, 2012
INVENTOR(S) : Jiang Du It is certified that error appears in the above-identified patent and that said Letters Patent is hereby corrected as shown below:

On Title Page 2, in Item (56), under "OTHER PUBLICATIONS", in Column 1, Line 36, please delete "miscroscope" and insert -- microscope --, therefor.

On Title Page 3, in Item (56), under "OTHER PUBLICATIONS", in Column 1, Line 66, please delete "Detectedby" and insert -- Detected by --, therefor.

On Title Page 3, in Item (56), under "OTHER PUBLICATIONS", in Column 2, Line 20, please delete "Chaper" and insert -- Chapter --, therefor.

In Column 3, Line 21, in Heading, please delete "DESCRIPTION OF DRAWINGS" and insert -- BRIEF DESCRIPTION OF DRAWINGS --, therefor.

Signed and Sealed this
Twenty-fifth Day of September, 2012

David J. Kappos
*Director of the United States Patent and Trademark Office*